United States Patent [19]

Watanabe

[11] Patent Number: 4,886,986
[45] Date of Patent: Dec. 12, 1989

[54] OUTPUT SIGNAL PROCESSOR CIRCUIT OF CHARGE TRANSFER DEVICE

[75] Inventor: Takashi Watanabe, Kyoto, Japan

[73] Assignee: Sharp Kabushiki Kaisha, Osaka, Japan

[21] Appl. No.: 757,176

[22] Filed: Jul. 22, 1985

[30] Foreign Application Priority Data

Jul. 25, 1984 [JP] Japan ................. 59-157852

[51] Int. Cl.$^4$ .................. H03K 5/08; G11C 27/02
[52] U.S. Cl. .................. 307/353; 307/542; 307/549
[58] Field of Search ............ 307/352, 353, 540, 542, 307/555, 549

[56] References Cited

U.S. PATENT DOCUMENTS

| | | | |
|---|---|---|---|
| 3,781,574 | 12/1973 | White et al. | 307/353 |
| 4,223,234 | 9/1980 | Levine | 307/362 |
| 4,454,435 | 6/1984 | Burns | 307/542 |

FOREIGN PATENT DOCUMENTS 55-163693 12/1980 Japan.
56-123072 9/1981 Japan.
57-142068 9/1982 Japan.

OTHER PUBLICATIONS

P. W. Fry, "Silicon Photodiode Arrays", *Journal of Physics E*, vol. 8, No. 5, May 1975, pp. 337-349.

*Primary Examiner*—John Zazworsky
*Attorney, Agent, or Firm*—Birch, Stewart, Kolasch & Birch

[57] ABSTRACT

Disclosed is an output signal processor circuit of a charge transfer device including a charge-detect circuit forming output signals of the charge transfer device, where the output signal is provided with a first and second levels; a clamp circuit clamping signal output from the charge-detect circuit at a specific level; a sampling circuit, sampling signals output from the charge-detect circuit; and an integration circuit, integrating signals output from the charge-detect circuit.

4 Claims, 4 Drawing Sheets

1

OUTPUT SIGNAL PROCESSOR CIRCUIT OF CHARGE TRANSFER DEVICE

BACKGROUND OF THE INVENTION

The present invention relates to an output signal processor circuit built in a charge transfer device (CTD) such as a charge-coupled device (CCD) or a bucket bridge device (BBD), and more particularly, to the output signal processor circuit of a charge transfer device which is capable of drastically reducing noise components from output signals.

Conventionally, any existing charge transfer device (CTD) such as a charge-coupled device (CCD) or bucket bridge device (BBD) deals with signals as charges and transfers them synchronously with externally applied clock pulses. However, output signal processors of such conventional charge transfer devices cannot sufficiently reduce noise components from outgoing signals, thus unavoidably causing a reduction in the signal level. There is a growing demand for the realization of a useful output signal processor circuit available for a charge transfer device, which should be capable of effectively and drastically reducing noise components from such bands close to sampling frequencies.

SUMMARY OF THE INVENTION

In the light of such an urgent problem the present invention aims at providing an extremely useful output signal processor circuit available for a charge transfer device, which is capable of drastically reducing noise components from output signals of the charge transfer device without causing a reduction of the signal level. Another object of the present invention is to provide an output signal processor circuit for the charge transfer device, which is capable of sharply reducing noise components from such bands in the periphery of sampling frequencies fc without causing the signal level to lower, thus drastically reducing noise components that would otherwise reflect onto low-frequency band signals. A further object of the present invention is to provide a useful output signal processor circuit for a charge transfer device, which is capable of sharply reducing noise components from signals output from the charge transfer device by applying a correlative double sampling (CDS) method.

Yet another object of the present invention is the provision of a useful output signal processor circuit for a charge transfer device, which, by applying a simplified integral averaging means, is capable of sharply reducing noise components from high-frequency band signals that would otherwise reflect onto low-frequency band signals.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To securely achieve those objects mentioned above, the output signal processor circuit of the charge transfer device reflecting one of the preferred embodiments of the present invention is typically comprised of the following: a charge detect means for generating signals provided with a first and second levels to be output from the charge transfer device; a clamp means for clamping the output signals from the said charge detect means at a specific level; a sampling means for sampling signals sent out of the said charge detect means; and an integral means for integrating signals sent out of the said charge detect means. Furthermore, to stably achieve those objects, the preferred embodiments of the present invention are comprised of the following: an output signal processor circuit of a charge transfer device containing the said charge detect means that forms both a black level and signal level each transfer period; a clamp means that clamps signals from the said charge detect means; and a sampling means that samples signals sent out of the said charge detect means at a specific signal level after output signals are clamped at the black level. The output signal processor circuit of the charge transfer device reflecting the preferred embodiments is also provided with a means for averaging the integrated values either between said clamping and sampling means or in front of the clamp means, while providing an average period of integration executed by the said integral averaging means for a period long enough to comprise periods of the said signal levels within every transfer period in order for the noise components in the high-frequency band signal to be suppressed, thus making it possible for the entire system to effectively minimize noise components that would otherwise reflect onto low-frequency band signals.

BRIEF DESCRIPTION OF THE DRAWINGS

The present invention will be better understood from the detailed description given hereinbelow and the accompanying drawings which are given by way of illustration only, and thus are not limitative of the present invention and wherein.

Figure 1:
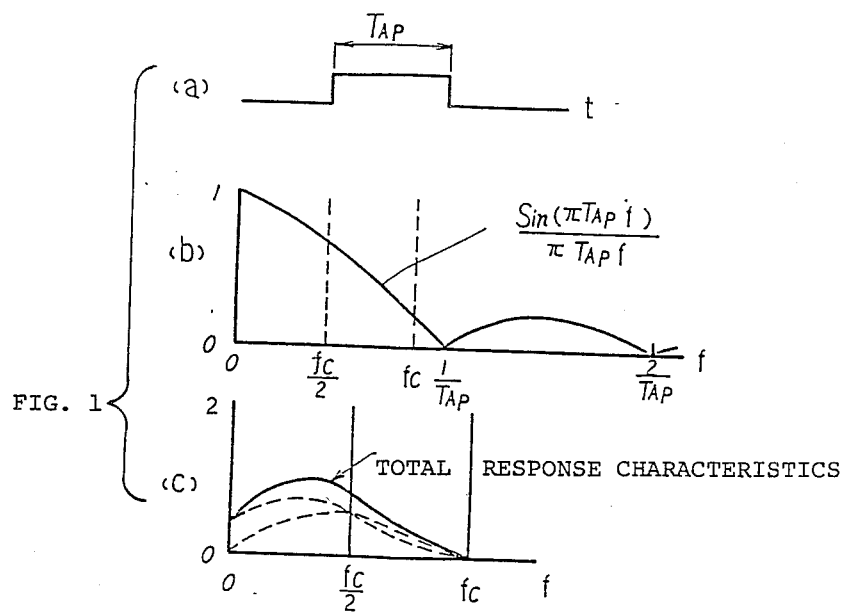
FIG. 1, (a) is the aperture width after applying an integral averaging process.
Figure 2:
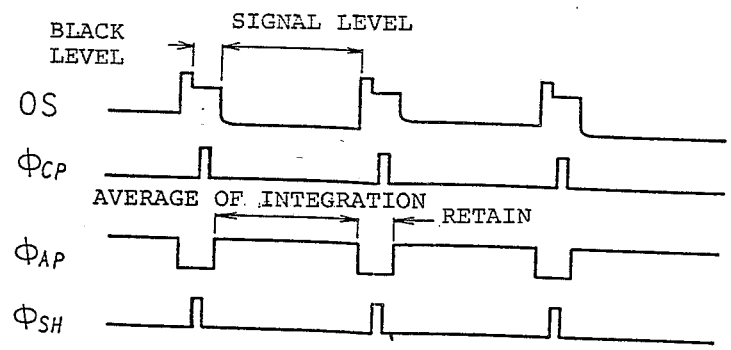
Figure 3:
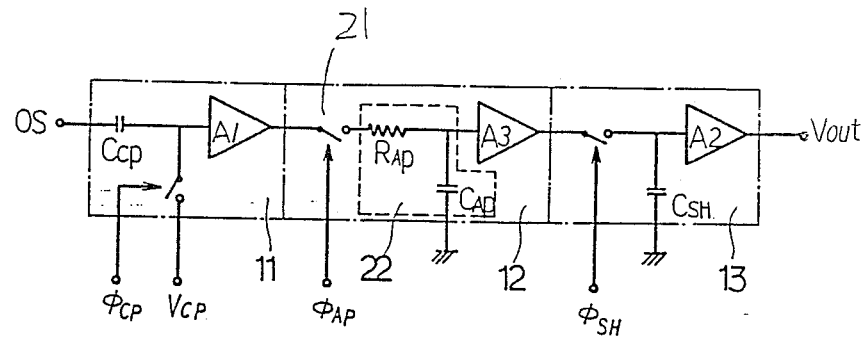
Figure 4:
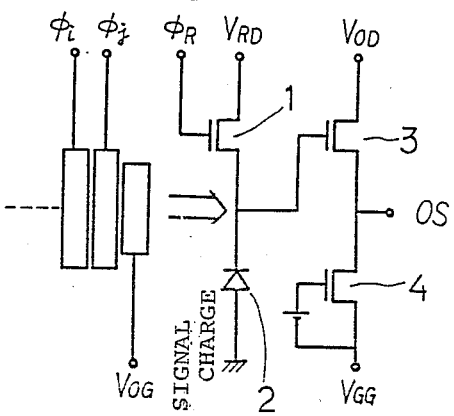
Figure 5:
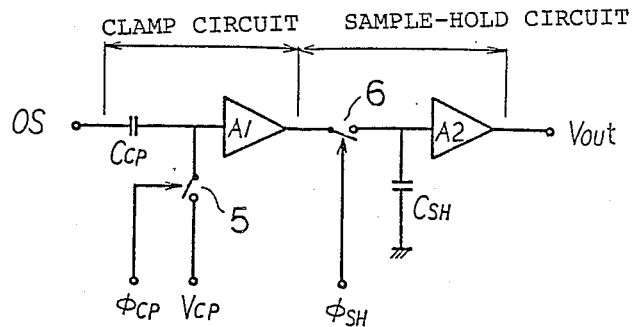
Figure 6:
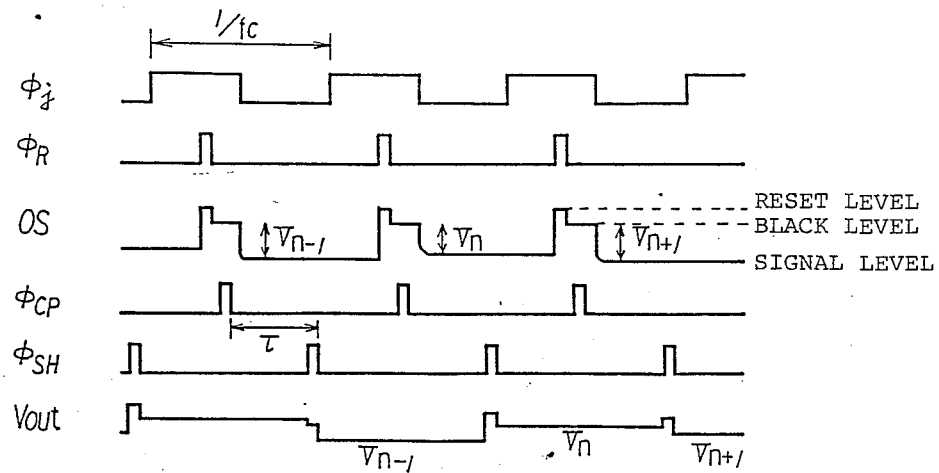
Figure 7A:
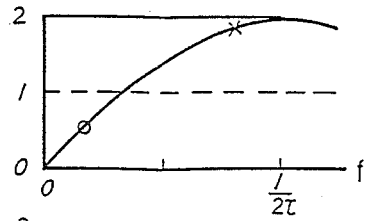
Figure 7B:
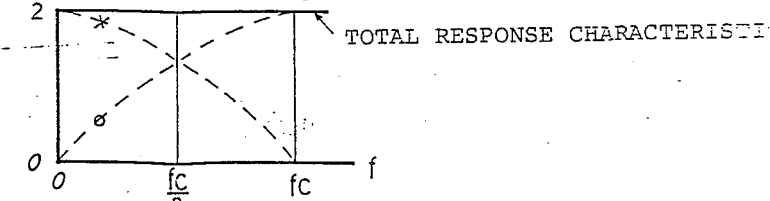
Figure 7C:
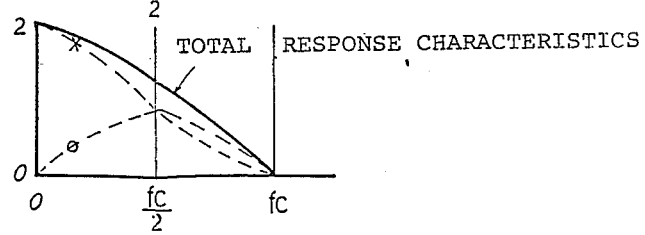

(b) is the frequency response shown after applying the integral averaging process;

(c) is the frequency response of noise components when the frequency response relationship shown in FIG. 1 (b) is applied to the example shown in FIG. 7 (c);

FIG. 2 is the operation timing chart of the output signal processor circuit of the charge transfer device reflecting the preferred embodiments of the present invention;

FIG. 3 is a simplified block diagram of an output signal processor circuit of a charge transfer device used for executing operations shown in FIG. 2, reflecting the preferred embodiments of the present invention;

FIG. 4 is a simplified block diagram of the output circuit of a charge transfer device that can be connected to the output signal processor circuit embodied by the present invention;

FIG. 5 is a simplified circuit diagram used for explaining the correlative double sampling (CDS) method featuring the preferred embodiments of the present invention;

FIG. 6 is an operation timing chart of the circuit shown in FIG. 5;

FIG. 7 (a) is a chart showing the frequency response of noise components after collecting differences between signals provided with timewise intervals called "z".

Figure 8:
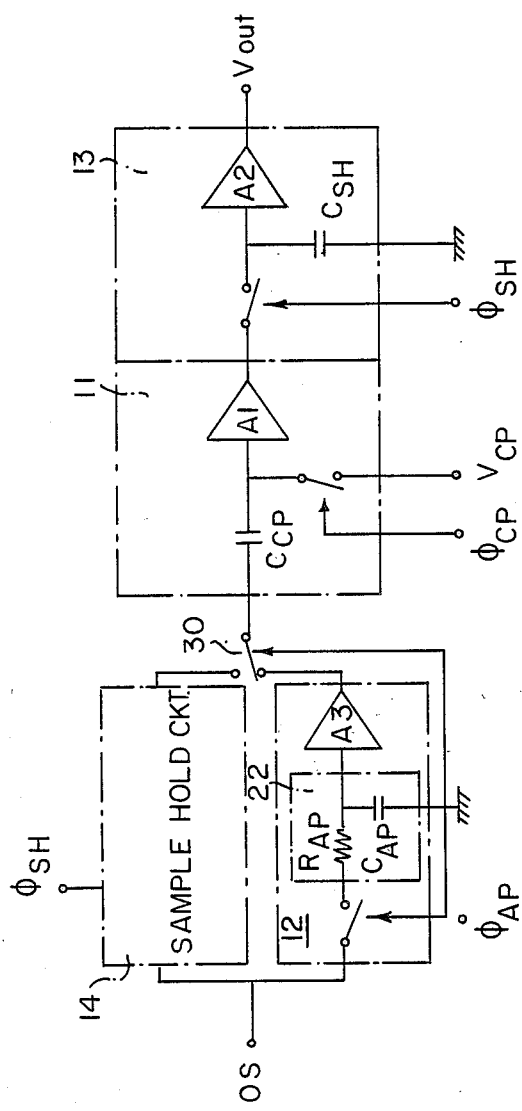

FIG. 7 (b) is a chart showing the frequency response of noise components when the signal shown in FIG. 7 (a) is sampled by applying the sampling frequency fc;

FIG. 7 (c) is a chart showing the frequency response of noise components when the signal shown in FIG. 7 (b) is sample-held;

FIG. 8 is a block diagram of an alternate embodiment of FIG. 3; and

Figure 9:
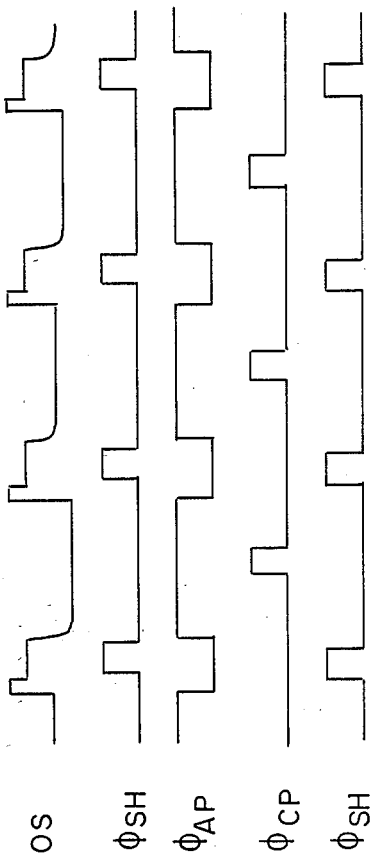

FIG. 9 is an operation timing chart of the circuit of FIG. 8.

DETAILED DESCRIPTION OF THE INVENTION

First, before describing one of the preferred embodiments of the present invention, the principle of the "correlative double sampling (CDS) method" embodied by the present invention is described below.

The charge transfer device cited in the present invention is typically denoted by either the charge-coupled device (CCD) or the bucket bridge device (BBD). Generally, the output unit of the charge transfer device comprises a detector circuit that converts the signal charge into a specific voltage and an amplifier circuit that draws out the converted voltage. First, the detector circuit containing a free capacitor with reset switch employed by the preferred embodiments of the present invention is described below. The detector circuit first closes the reset switch so that the potential of the free capacitor can be set at the externally supplied reset potential (VRD) and then opens the reset switch to allow the free capacitor to contain a specific voltage on receipt of signal charge.

These serial operations are repeatedly executed in every transfer period in order for variable components of the voltage charged in the free capacitor to be extracted from the amplifier circuit. A typical example is shown in FIG. 4, in which MOS-FET 1 is made available as the reset switch of the detector circuit, while the positive-negative-coupled reverse-biased diode 2 is made available as the free capacitor. Reset clock ($\phi$R) is transmitted to the gate of MOS-FET 1 which functions as the reset switch. A source-follower circuit comprised of MOS-FETs 3 and 4 makes up the amplifier circuit. Note that a positive-type substrate is used for the circuits shown in FIG. 4 and in conjunction with the following description. Such circuits shown in FIG. 4 also use signal charge for processing electrons. The same explanation can also be applied to the case where polarity is reversed by inverting the polarity of the drive voltage. The following description refers to the case where the charge-coupled device is made available for the charge transfer device. Note that the same explanation can also be applied to the operation of the bucket bridge device despite its performance characteristics being slightly inferior to those of the charge-coupled device. Referring now to the charge-coupled device, although substantially a low-noise element, it nevertheless causes some noise components in the input unit which generates and feeds the signal charge. Such noise components also exist in the transmission path, detector and amplifier circuits as well, thus eventually causing a reduction in the signal-to-noise (S/N) ratio of the charge-coupled device. To significantly improve the S/N ratio, the preferred embodiments of the present invention use the correlative double sampling (CDS) method, the details of which are described below.

FIG. 5 shows the operation of such circuits using the correlative double sampling method. Signal OS is output from the charge-coupled device, provided by the output circuit shown in FIG. 4. During this period, the reset clock pulse $\phi$R goes Low before the finally-transferred clock pulse $\phi$j from the charge-coupled device goes Low to allow the black level to appear. Conversely, the signal level appears during the period in which the reset clock pulse $\phi$R goes High after the finally-transferred reset clock pulse $\phi$j is turned Low. Referring now to FIG. 5, signal OS is routed via the AC-coupled clamp capacitor (Ccp) into two paths. One is led to clamp switch 5 and the other to buffer amplifier A1. Clamp switch 5 is opened and closed by applying clamp clock pulse $\phi$cp to clamp signal OS which remains at the external potential Vcp during the black level period. The clamped signal OS is then delivered to the sample-hold circuit via buffer A1 that contains a high-impedance input. Signal OS first passes through sample-switch 6 which is opened and closed by the sample-hold clock pulse $\phi$SH, which is then sampled during the signal-level period of signal OS; the sampled signal OS is then delivered to the following sample-hold capacitor (CSH). The potential being sample-held by the sample-hold capacitor (CSH) is eventually output in the form of output signal Vout via buffer A2 containing high-impedance input.

FIG. 6 shows the timing relationship between clock pulses and signals shown in FIG. 4 and 5. As is clear from those operations described above, the circuit shown in FIG. 5 eventually generates an output signal Vout that collects the differences in the potentials between the signal level and the preceding black level of signal OS in every transfer period, and, as a result, the signal value of signal OS from the charge-coupled device (CCD) is eventually output in the sample-held state. At the same time, noise components contained in signal OS are suppressed in the low-frequency bands, thus indicating the response characteristics shown in FIG. 7 (a). Symbol "$\tau$" indicates the time difference between the clamp clock pulse $\phi$cp and the sample-held clock pulse $\phi$SH. Nevertheless, in reality, high-frequency-band signals above the level fc/2 (representing Nyquist frequency fN) reflect themselves onto the low-frequency band signals as a result of the sampling operation performed by the sample-hold circuit as shown in FIG. 7 (b). The high-frequency-band signal above the level fc/2 eventually generates the response characteristics shown in FIG. 7 (c), being affected by the specific frequency characteristics generated by the sample-hold operation. As a result, if signal OS contains such noise components having a relatively high-frequency level in the periphery of the sampling frequency fc, they will easily reflect onto the low-frequency band signals. Consequently, such a circuit as is shown in FIG. 5 cannot sufficiently reduce noise components from the low-frequency band signals.

We now refer to FIG.; 1,(a), (b) and (c), and FIGS. 2 and 3 for operations of the output signal processor circuit of a charge transfer device (CTD) capable of reducing noise components from low-frequency band signals reflected in one of the preferred embodiments of the present invention which is described below. FIG. 1, (a), (b) and (c) respectively explain the concept of the operations performed by the output signal processor circuit embodied by the present invention. Of these, FIG. 1 (a) shows the aperture width after applying an integral averaging; FIG. 1 (b) shows the frequency response after performing the integral averaging operation shown in FIG. 1(a), and FIG. 1 (c) shows the noise frequency response when the relationship denoted in FIG. 1 (b) is applied to the example shown in FIG. 7 (c). First, consideration is given to such an aperture circuit containing the aperture width TAP against the time axis "t" shown in FIG. 1 (a). The aperture circuit executes the integral averaging operation of the signals inside the aperture width TAP, which are variable according to time factors. Frequency characteristics can easily be sought during this period by converting the signal waveforms shown in FIG. 1 (a) by the application of the Fourier series, which causes such frequency characteristics to be generated as shown in FIG. 1 (b). In summary, such responsive function is represented by the equation:

$$R(f) = \frac{\sin(\pi \cdot TAPf)}{\pi \cdot TAPf}$$

As a result, the frequency characteristics will be those normally generated by a low-pass filter which causes the response to be reduced to zero by the effect of 1/TAP and by harmonics thereof. In other words, by setting the aperture width TAP at such a period corresponding to the period of the signal level of signal OS or slightly longer than this period, noise components can be removed effectively from high-frequency band signals without causing the signal level to vary at all. As a result, by effectively combining the above method with the correlative double sampling method, noise components can be securely prevented from reflecting themselves onto low-frequency band signals. This is represented in FIG. 1 (c). FIG. 2 is a timing chart denoting the relationship of the above operations. Of those OS signals generated in FIG. 6, a specific signal OS shown in FIG. 2 is first clamped by pulse $\phi$cp during the black level period. The clamped signal OS is then integrally averaged by pulse $\phi$AP for a sufficiently long period of time (TAP) including the signal level period, which is then withheld until the next integral averaging starts. Thus, the integrally averaged value in every transfer period is withheld during the period mentioned above, and then sample-held by pulse $\phi$SH. As a result, signal Vout containing the noise response characteristics shown in FIG. 1 (c) is eventually output. As is clear from FIG. 1 (b), the closer the period TAP to the transfer period 1/fc, the lower the noise response at the level of sampling frequency fc will be. Therefore, the period TAP should be extended as long as possible within the transfer cycle.

On the other hand, if the period TAP is extended beyond the signal level period, the integrally averaged signal value will diminish itself. To prevent this, the signal level should also be extended as long as possible within the transfer cycle. To securely realize this, as is clear from FIG. 6, the high-level period of pulse $\phi$R, i.e., the closed period of the reset switch, should be as short as possible. Likewise, the black-level period from the fall of pulse $\phi$R to the rise of pulse $\phi$j should also be as short as possible within a range within which clamping can be done by means of pulse $\phi$cp.

FIG. 3 is a simplified block diagram of the circuit used for executing the operations shown in FIG. 2 reflecting one of the preferred embodiments of the present invention. Signal OS from the charge-coupled device having the circuit shown in FIG. 4 is first delivered to clamp circuit 11 having the configuration shown in the first-half portion of FIG. 5, which is then sent to the integral averaging circuit 12. In other words, signal OS is delivered to the integration circuit 22 comprising resistor RAP and capacitor CAP via switch 21 which is closed by pulse $\phi$AP during the period TAP in each transfer cycle. The value of an integrated time constant rAP=RAP.CAP is determined by its relationship with the TAP period. The integration circuit substantially makes up the sample-hold circuit itself, and therefore, the integrally averaged signal during the TAP period is stored in capacitor CAP until the next integral averaging operation starts. This signal is then delivered to the final-stage sample-hold circuit 13 via buffer amplifier A3 which is provided with a high-impedance input. The final-stage sample-hold circuit 13 comprises a configuration similar to the latter-half portion of the circuit shown in FIG. 5. The difference is that in FIG. 3, the sample-hold circuit 13 samples the processed signals using pulse $\phi$SH during the period in which the integrally averaged value is still held in the preceding circuit.

With reference to FIGS. 2 and 3, the foregoing description referred to the case in which an integral averaging circuit 12 is inserted between the clamp circuit 11 and the sample-hold circuit 13. This configuration may be substituted by other means. For example, if the integral averaging circuit 12 is of such a configuration capable of executing the integral averaging operation within the signal level of signal OS to allow both the integrally averaged signal and the unprocessed black-level signal to exist in every transfer period, then it is apparent that frequency characteristics identical to those shown in FIG. 1(b) and (c) and 7(a) to (c) can be realized by arranging the entire system in a different order, namely, the integral averaging circuit, followed by the clamp circuit, and the sample-hold circuit as shown in FIG. 8.

In such an embodiment, however, an additional sample-hold circuit 14 must be provided to apply black level signals to clamp circuit 11. A switch 30 switches between the output of circuit 14 and circuit 12. FIG. 9 illustrates the timing of operation of the circuit of FIG. 8. In summary, the essence of the present invention is to effectively combine the execution of the signal clamping operation at the black level with the sample-hold operation after averaging the integrated values at the signal level.

As is clear from the foregoing detailed description, the preferred embodiments of the present invention make it possible for the output signal processor circuit to drastically reduce noise components from high-frequency-band signals as well as such noise components that will otherwise reflect onto low-frequency band signals merely by adding a simplified integral averaging means to the output signal processor circuit of the charge transfer device.

The present invention provides another preferred embodiment in which the correlation double sampling circuit is provided with an integration circuit that constantly integrates both the signal level and the black level for a specific period of time.

The invention being thus described, it will be obvious that it may be varied in many ways. Such variations are not to be regarded a a departure from the spirit or scope of the invention, and all such modifications are intended to be included within the scope of the following claims.

What is claimed is:

1. An output signal processor circuit of a charge transfer device, comprising:

charge-detect means for forming output signals of a charge transfer device, said output signals containing first and second levels;

clamp means for clamping said output signals from said charge-detect means at a predetermined level during an interval corresponding to said first level of said output signals;

integrating means connected to said clamp means, for integrating said output signals only during an interval corresponding to said second level of said output signals; and sample-and-hold means for sampling said integrated signals and outputting signals corresponding to information stored in said charge transfer device, said signals outputted by said sample-and-hold means being substantially free of high frequency noise components.

2. An output signal processor circuit of a charge transfer device, comprising:

charge-detect means for forming both black level and signal level periods of an output signal of a charge transfer device;

clamp means for clamping said output signal at a predetermined level during the black level period thereof;

integral averaging means for performing an integral averaging operation on the clamped output signal only during a period including said signal level period; and sampling means for sampling said integral-averaged signals during the signal level of said output signal, high-frequency noise components thus being suppressed in high-frequency components of said output signal and minimized from low-frequency components of said output signal.

3. An output signal processor circuit of a charge transfer device defined in claim 2 wherein the charge-detect means comprises:

a free capacitor provided with a reset switch, where a closed period of the reset switch is set shorter than each transfer period, while the period between an opening of the reset switch and a start of the transmission of signal charge into the free capacitor is relatively shortened, thus allowing said signal-level period to be extended sufficiently to eventually cause the averaged valve of integration obtained by said integral averaging operation to rise after integrating signals using the integral averaging means.

4. An output signal processor circuit of a charge transfer device, comprising:

charge-detect means for forming output signals of a charge transfer device, said output signals containing first and second levels;

integrating means for integrating said output signals only during the second level thereof;

clamp means for clamping said output signals during the first level thereof and passing said integrated output signals without clamping; and sample-and-hold means for sampling said integrated signals during said second level, and outputting signals indicative of information stored in said charge transfer device which are substantially free of high frequency noise components.

* * * * *